(12) United States Patent
Hung

(10) Patent No.: US 6,476,474 B1
(45) Date of Patent: Nov. 5, 2002

(54) DUAL-DIE PACKAGE STRUCTURE AND METHOD FOR FABRICATING THE SAME

(75) Inventor: Chin Yuan Hung, Fengyuan (TW)

(73) Assignee: Siliconware Precision Industries Co., Ltd. (TW)

( * ) Notice: Subject to any disclaimer, the term of this patent is extended or adjusted under 35 U.S.C. 154(b) by 35 days.

(21) Appl. No.: 09/686,100

(22) Filed: Oct. 10, 2000

(51) Int. Cl.$^7$ .................. H01L 23/34; H01L 23/495; H01L 23/02
(52) U.S. Cl. .................. 257/686; 257/685; 257/646; 257/693; 257/493; 257/723; 257/777; 257/784; 257/786; 257/676
(58) Field of Search .................. 257/646, 676, 257/685, 686, 692, 693, 696, 698, 723, 777, 784, 786

(56) References Cited

U.S. PATENT DOCUMENTS

| | | | |
|---|---|---|---|
| 5,422,435 A | * | 6/1995 | Takiar et al. ............... 257/700 |
| 5,777,345 A | * | 7/1998 | Loder et al. ............... 257/777 |
| 5,780,925 A | * | 7/1998 | Cipolla et al. ............... 257/777 |
| 5,814,881 A | | 9/1998 | Alagaratnam et al. ...... 257/686 |
| 6,133,637 A | * | 10/2000 | Hikita et al. ............... 257/777 |
| 6,239,366 B1 | * | 5/2001 | Hsuan et al. ............... 257/777 |
| 6,252,305 B1 | * | 6/2001 | Lin et al. ............... 257/777 |
| 6,307,257 B1 | * | 10/2001 | Huang et al. ............... 257/777 |
| 6,316,727 B1 | * | 11/2001 | Lin ............... 257/686 |
| 6,316,822 B1 | * | 11/2001 | Venkateshwaran et al. . 257/666 |

* cited by examiner

Primary Examiner—Alexander O. Williams
(74) Attorney, Agent, or Firm—Peter F. Corless; Steven M. Jensen; Edwards & Angell, LLP

(57) ABSTRACT

A dual-die packaging technology is proposed to pack two semiconductor chips in one single package module, so that one single package module is capable of offering a doubled level of functionality or data storage capacity. The proposed dual-die packaging technology is characterized in the use of a face-to-face stacked dual-die construction to pack two integrated circuit chips, such as flash memory chips, in one single package module. The first semiconductor die has its non-circuit surface attached to the front side of the die pad of the leadframe, while the second semiconductor die has its circuit surface attached by means of adhesive layer to the circuit surface of the first semiconductor die, thus forming a face-to-face stacked dual-die construction over the die pad of the leadframe, allowing one single package module to offer a doubled level of functionality or data storage capacity.

10 Claims, 2 Drawing Sheets

DUAL-DIE PACKAGE STRUCTURE AND METHOD FOR FABRICATING THE SAME

BACKGROUND OF THE INVENTION

1. Field of the Invention

This invention relates to semiconductor packaging technology, and more particularly, to a duel-due package structure and method of fabricating the same, which is characterized in the use of a face-to-face stacked dual-die construction to pack two integrated circuit chips in one single package module.

2. Description of Related Art

Integrated circuit chips are typically enclosed in protective packages that can be easily handled and mounted onto printed circuit boards (PCB). A single package can be used to enclose one or more integrated circuit chips therein.

Dual-die packaging technology is used to pack two integrated circuit chips in one single package module, so that one single package module is capable of offering a double level of functionality or data storage capacity. Memory chips, such as flash memory chips, are typically packaged in this way so as to allow one single memory module to offer a doubled level of data storage capacity. Conventionally, various kinds of dual-die packaging technologies have been developed and utilized in the semiconductor industry, such as the one illustrated in FIG. 1.

As shown in FIG. 1, this conventional dual-die package structure comprises a first semiconductor die 10, a second semiconductor die 20, and a leadframe 30. The first semiconductor die 10 has a circuit surface (or called active surface) 10a and a non-circuit surface (or called inactive surface) 10b, and is formed with a lined array of bond pads 11 on one edge of the circuit surface 10a thereof (only one bond pad is shown in the schematic sectional diagram of FIG. 1). Similarly, the second semiconductor die 20 has a circuit surface 20a and a non-circuit surface 20b, and is formed with a lined array of bond pads 21 on one edge of the circuit surface 20a thereof (only one bond pad is shown in the schematic sectional diagram of FIG. 1). The first semiconductor die 10 and the second semiconductor die 20 can be each a memory chip, such as a flash memory chip. Besides, they can also be various other kinds of integrated circuit chips, such as microcontroller chips.

The leadframe 30 includes a first set of conductive leads 31, a second set of conductive leads 32, and a die pad 33. The two sets of conductive leads 31, 32 are arranged on opposite sides of the die pad 33. The first set of conductive leads 31 have a front side 31a and a back side 31b, and the second set of conductive leads 32 have a front side 32a and a back side 32b. The die pad 33 has a front side 33a and a back side 33b, and which is arranged at a leveled position with respect to the two sets of conductive leads 31, 32. The first semiconductor die 10 has its non-circuit surface 10b securely attached by means of a first adhesive layer 12 to the front side 33a of the die pad 33, while the second semiconductor die 20 has its non-circuit surface 20b securely attached by means of a second adhesive layer 22 to the back side 33b of the die pad 33.

Further, a first set of bonding wires 41 are interconnected between the bond pads 11 of the first semiconductor die 10 and the front side 31a of the first set of conductive leads 31 for electrically coupling the first semiconductor die 10 to the first set of conductive leads 31; and a second set of bonding wires 42 are interconnected between the bond pads 21 of the second semiconductor die 20 and the back side 32b of the second set of conductive leads 32 for electrically coupling the second semiconductor die 20 to the second set of conductive leads 32. After this, an encapsulation process is performed to form a molded compound 50 for encapsulating the first semiconductor die 10 and the second semiconductor die 20.

The foregoing dual-die package structure is one example of the prior art. Other related patents include, for example, the U.S. Pat. No. 5,814,881 entitled "STACKED INTEGRATED CHIP PACKAGE AND METHOD OF MAKING SAME". This patented technology is characterized in the use of a back-to-back stacked dual-die construction on one side of the die pad of leadframe for packing two integrated circuit chips in one single package module.

SUMMARY OF THE INVENTION

It is an objective of this invention to provide a new dual-die packaging technology which can be used to pack two integrated circuit chips in one single package module.

In accordance with the foregoing and other objectives, the invention proposes a new dual-die packaging technology for packing two integrated circuit chips in one single package module.

In terms of package structure, the dual-die packaging technology of the invention comprises: (a) a leadframe including a die pad, a first set of conductive leads on side of the die pad, and a second set of conductive leads on opposite sides of the die pad; the fist set of conductive leads and the second set of conductive leads each having a front side and a back side; (b) a first semiconductor die having a circuit surface and a non-circuit surface and including an array of bond pads on one edge of the circuit surface thereof, and whose non-circuit surface is attached to the die pad of the leadframe; (c) a second semiconductor die having a circuit surface and a non-circuit surface and including an array of bond pads on one edge of the circuit surface thereof, and whose circuit surface is attached to the circuit surface of the first semiconductor die; (d) a first set of bonding wires for electrically connecting the bond pads of the first semiconductor die to the front side of the first set of conductive leads of the leadframe; (e) a second set of bonding wires for electrically connecting the bond pads of the second semiconductor die to the back side of the second set of conductive leads of the leadframe; and (f) a molded compound for encapsulating the first semiconductor die and the second semiconductor die.

In terms of fabrication method, the dual-die packaging technology of the invention comprises the following steps of: (1) preparing a first semiconductor die, a second semiconductor die, and a leadframe; the leadframe including a die pad, a first set of conductive leads on side of the die pad, and a second set of conductive leads on opposite side of the die pad; the first set of conductive leads and the second set of conductive leads each having a front side and a back side; and the first semiconductor die and the second semiconductor die each having a circuit surface and a non-circuit surface and including an array of bond pads on one edge of the circuit surface thereof; (2) performing a first die-bonding process, wherein the non-circuit surface of the first semiconductor die is attached to the front side of the die pad of the leadframe; (3) performing a second die-bonding process, wherein the circuit surface of the second semiconductor die is attached to the circuit surface of the first semiconductor die; (4) performing a first wire-bonding process to electrically connect the bond pads of the first semiconductor die to the front side of the first set of conductive leads of the leadframe; (5) performing a second wire-bonding process to electrically connect the bond pads of the second semiconductor die to the back side of the second set of conductive leads of the leadframe; and (6) performing an encapsulation process to form a molded compound for encapsulating the first semiconductor die and the second semiconductor die.

The foregoing dual-die packaging technology of the invention is characterized in the use of a face-to-face stacked dual-die construction, which is distinguishable from the back-to-back stacked dual-die construction of the prior art, for packing two semiconductor chips in one single package module, so that the one single package module is capable of offering a doubled level of functionality or data storage capacity.

BRIEF DESCRIPTION OF THE DRAWINGS

The invention can be more fully understood by reading the following detailed description of the preferred embodiments, with reference made to the accompanying drawings, wherein.

DETAILED DESCRIPTION OF PREFERRED EMBODIMENTS

A preferred embodiment of the dual-die packaging technology according to the invention is disclosed in full details in the following with reference to FIGS. 2A–2F.

Figure 1:
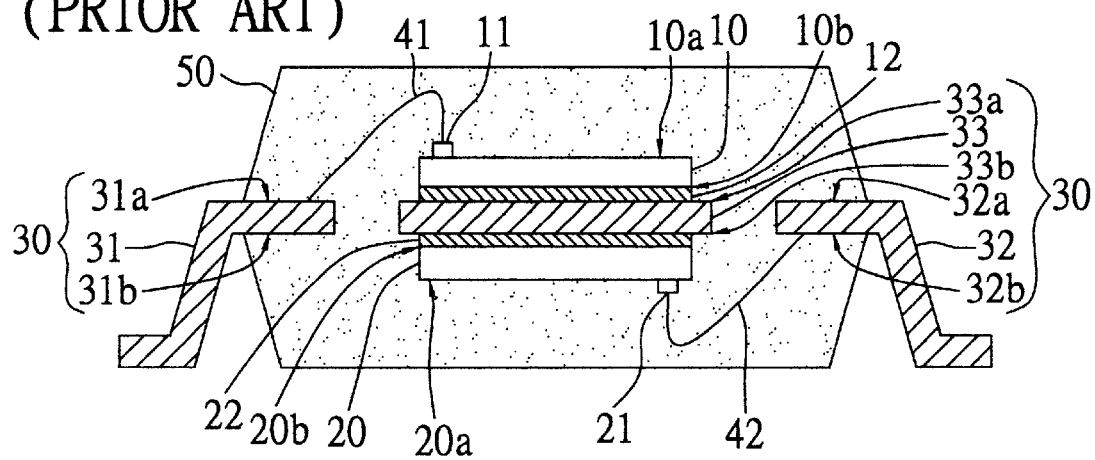
FIG. 1 (PRIOR ART) is a schematic sectional diagram of a conventional dual-die package structure.
Figure 2A:
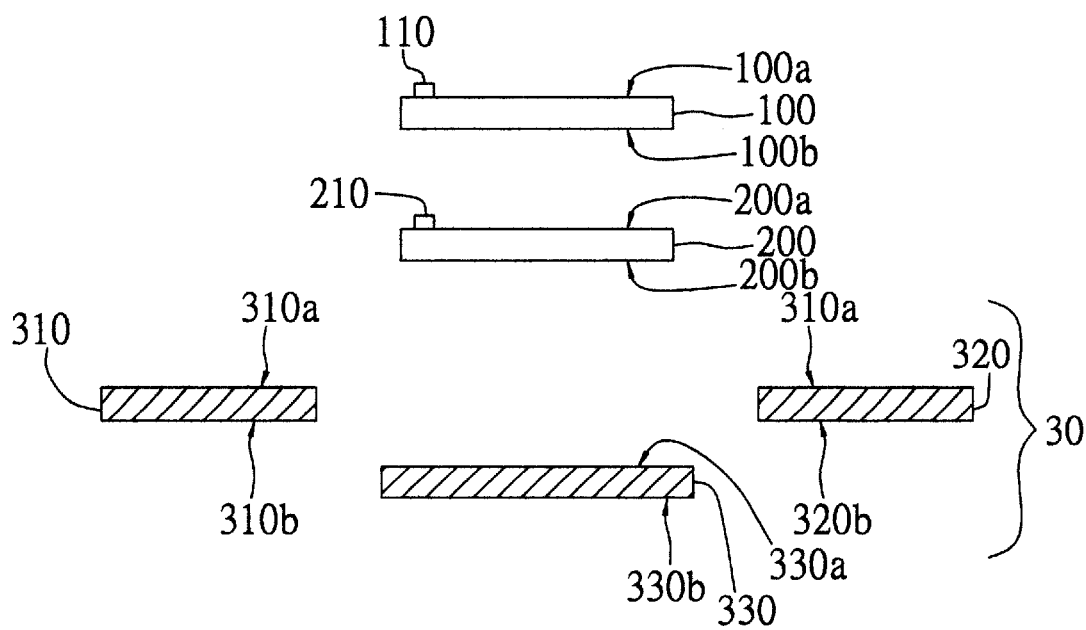
FIGS. 2A–2F are schematic sectional diagrams used to depict the fabrication steps involved in the dual-die packaging technology of the invention for the fabrication of a dual-die package.

Referring to FIG. 2A, by the fabrication method according to the dual-die packaging technology of the invention, the first step is to prepare a first semiconductor die 100, a second semiconductor die 200, and a leadframe 300.

The first semiconductor die 100 has a circuit surface 100a and a non-circuit surface 100b, and is formed with a lined array of bond pads 110 on one edge of the circuit surface 100a thereof (only one bond pad is shown in the schematic sectional diagram of FIG. 2A).

Similarly, the second semiconductor die 200 has a circuit surface 200a and a non-circuit surface 200b, and is formed with a lined array of bond pads 210 on one edge of the circuit surface 200a thereof (only one bond pad is shown in the schematic sectional diagram of FIG. 2A).

The first semiconductor die 100 and the second semiconductor die 200 can be each a memory chip, such as a flash memory chip. Besides, they can also be various other kinds of integrated circuit chips, such as microcontroller chips.

The leadframe 300 includes a first set of conductive leads 310, a second set of conductive leads 320, and a die pad 330. The two sets of conductive leads 310, 320 are arranged on opposite sides of the die pad 330. The first set of conductive leads 310 have a front side 310a and a back side 310b, and the second set of conductive leads 320 have a front side 320a and a back side 320b. The die pad 330 has a front side 330a and a back side 330b, and is arranged at a downset position with respect to the conductive leads 310, 320.

Figure 2B:
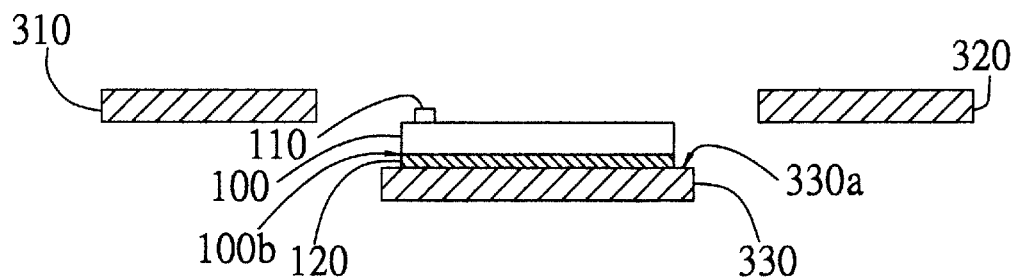

Referring further to FIG. 2B, in the next step, a first die-bonding process is performed for the first semiconductor die 100, in such a manner as to securely attach the non-circuit surface 100b of the first semiconductor die 100 by means of a first adhesive layer 120 to the front side 330a of the die pad 330.

Figure 2C:
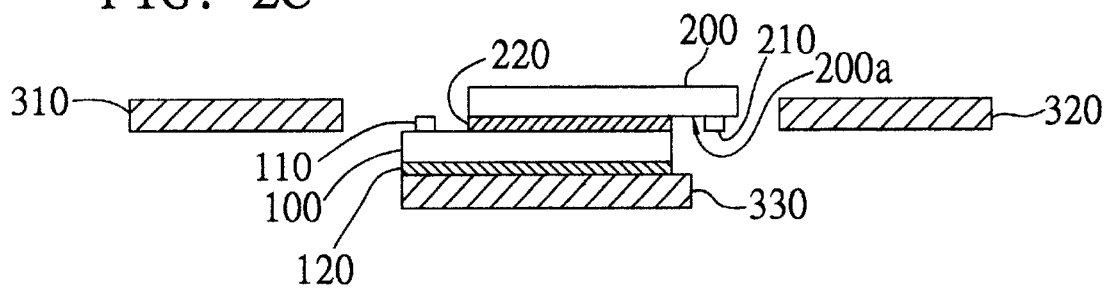

Referring further to FIG. 2C, in the next step, a second die-bonding process is performed for the second semiconductor die 200, in such a manner as to securely attach the circuit surface 200a of the second semiconductor die 200 excluding the bond pads 210 by means of a second adhesive layer 220 to the circuit surface 100a of the first semiconductor die 100 excluding the bond pads 110.

The attachment of the second semiconductor die 200 over the first semiconductor die 100 constitutes a face-to-face stacked dual-die construction over he die pad 330, with the bond pads 110 of the first semiconductor die 100 facing upwards and the bond pads 210 of the second semiconductor die 200 facing downwards.

Figure 2D:
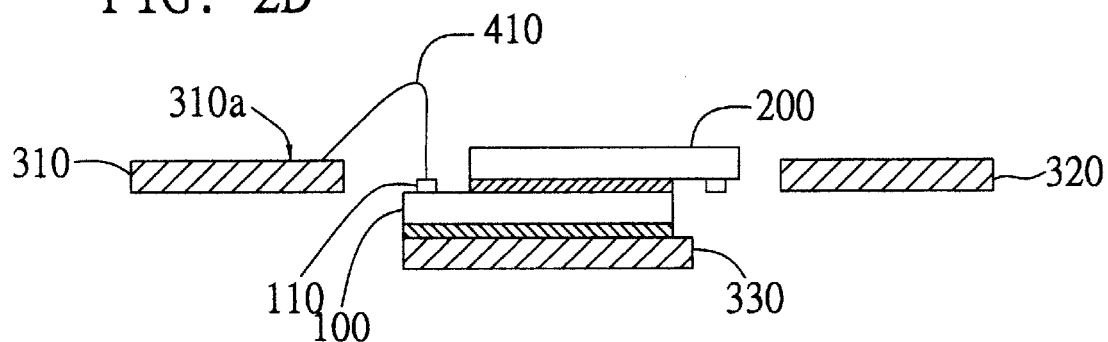

Referring further to FIG. 2D, in the next step, a first wire-bonding process is performed for the first semiconductor die 100, by which a first set of bonding wires 410 are interconnected between the bond pads 110 of the first semiconductor die 100 and the front side 310a of the first set of conductive leads 310 for electrically coupling the first semiconductor die 100 to the first set of conductive leads 310.

Figure 2E:
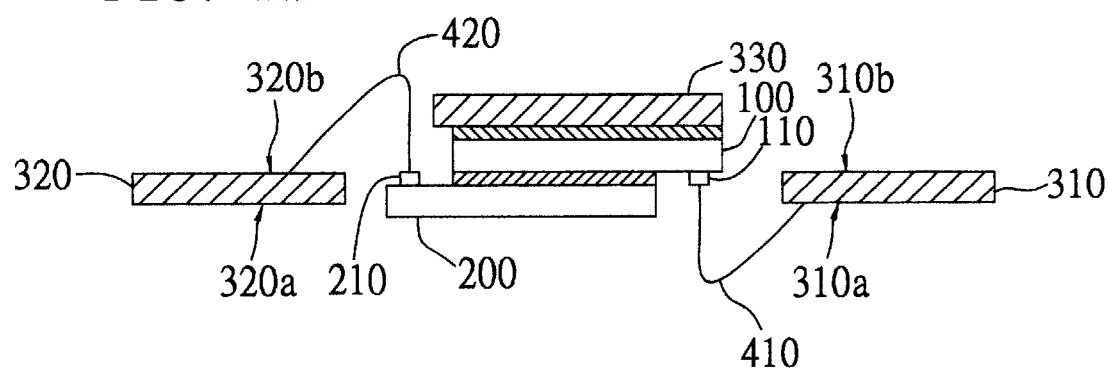

Referring further to FIG. 2E, in the next step, the entire semi-finished package construction is turned upside down so as to facilitate a second wire-bonding process for the second semiconductor die 200, by which a second set of bonding wires 420 are interconnected between the bond pads 210 of the second semiconductor die 200 and the back side 320b of the second set of conductive leads 320 for electrically coupling the second semiconductor die 200 to the second set of conductive leads 320.

Figure 2F:
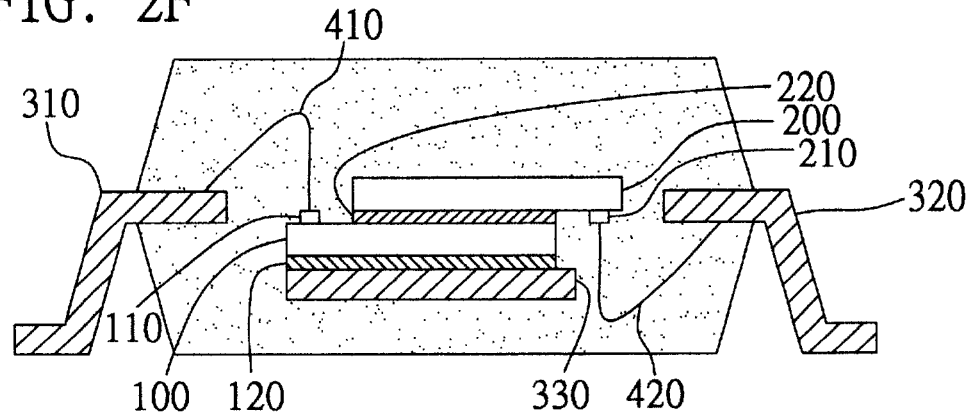

Referring further to FIG. 2F, in the next step, an encapsulation process is performed to form a molded compound 500 for encapsulating the first semiconductor die 100 and the second semiconductor die 200. This completes the fabrication process according to the dual-die packaging technology of the invention.

All subsequent processes to finish the dual-die package are conventional techniques and not within the spirit and scope of the invention, so description thereof will not be further detailed.

In conclusion, the invention provides a new dual-die packaging technology which is characterized in the use of a face-to-face stacked dual-die construction, which is distinguishable from the back-to-back stacked dual-die construction of the prior art, for packing two integrated circuit chips, such as flash memory chips, in one single package module, so as to allow one single package module to be capable of offering a doubled level of functionality or data storage capacity.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A dual-die package structure, which comprises:
   (a) a leadframe including a die pad, a first set of conductive leads on one side of the die pad, and a second set of conductive leads on an opposite side of the die pad, the first set of conductive leads and the second set of conductive leads each having a front side and a back side;
   (b) a first semiconductor die having a circuit surface and a non-circuit surface and including an array of bond pads on only one edge of the circuit surface thereof, and whose non-circuit surface is attached to the die pad of the leadframe;

(c) a second semiconductor die having a circuit surface and a non-circuit surface and including an array of bond pads on only one edge of the circuit surface thereof, and whose circuit surface is attached to the circuit surface of the first semiconductor die;

(d) a first set of bonding wires for electrically connecting the bond pads of the first semiconductor die to the front side of the first set of conductive leads of the leadframe;

(e) a second set of bonding wires for electrically connecting the bond pads of the second semiconductor die to the back side of the second set of conductive leads of the leadframe; and (f) a molded compound for encapsulating the first semiconductor die and the second semiconductor die.

2. The dual-die package structure of claim 1, wherein the first semiconductor die is a flash memory chip.

3. The dual-die package structure of claim 1, wherein the second semiconductor die is a flash memory chip.

4. The dual-die package structure of claim 1, wherein the first semiconductor die and the second semiconductor die are each a flash memory chip.

5. The dual-die package structure of claim 1, wherein the die pad of the leadframe is arranged at a downset position with respect to the first and second sets of conductive leads.

6. A method for fabricating a dual-die package, comprising the steps of:

(1) preparing a first semiconductor die, a second semiconductor die, and a leadframe, the leadframe including a die pad, a first set of conductive leads on one side of the die pad, and a second set of conductive leads on an opposite side of the die pad, the first set of conductive leads and the second set of conductive leads each having a front side and a back side, and the first semiconductor die and the second semiconductor die each having a circuit surface and a non-circuit surface and including an array of bond pads on only one edge of the circuit surface thereof;

(2) performing a first die-bonding process, wherein the non-circuit surface of the first semiconductor die is attached to the front side of the die pad of the leadframe;

(3) performing a second die-bonding process, wherein the circuit surface of the second semiconductor die is attached to the circuit surface of the first semiconductor die;

(4) performing a first wire-bonding process to electrically connect the bond pads of the first semiconductor die to the front side of the first set of conductive leads of the leadframe;

(5) performing a second wire-bonding process to electrically connect the bond pads of the second semiconductor die to the back side of the second set of conductive leads of the leadframe; and (6) performing an encapsulation process to form a molded compound for encapsulating the first semiconductor die and the second semiconductor die.

7. The method of claim 6, wherein in said step (1), the first semiconductor die is a flash memory chip.

8. The method of claim 6, wherein in said step (1), the second semiconductor die is a flash memory chip.

9. The method of claim 6, wherein in said step (1), the first semiconductor die and the second semiconductor die are each a flash memory chip.

10. The method of claim 6, wherein in said step (1), the die pad of the leadframe is arranged at a downset position with respect to the first and second sets of conductive leads.

* * * * *